United States Patent [19]

Watakabe et al.

[11] Patent Number: 4,717,625
[45] Date of Patent: Jan. 5, 1988

[54] PHOTOMASK MATERIAL

[75] Inventors: Yaichiro Watakabe; Shuichi Matsuda, both of Itami, Japan

[73] Assignee: Mitsubishi Denki Kabushiki Kaisha, Tokyo, Japan

[21] Appl. No.: 837,355

[22] Filed: Mar. 6, 1986

[30] Foreign Application Priority Data

Aug. 30, 1985 [JP] Japan .................. 60-192815

[51] Int. Cl.⁴ .................. B32B 15/00; B32B 17/06; G03F 9/00
[52] U.S. Cl. .................. 428/432; 428/428; 428/446; 430/5; 148/DIG. 19; 148/DIG. 147
[58] Field of Search .................. 430/5; 428/428, 432, 428/446; 148/DIG. 19, DIG. 147

[56] References Cited

U.S. PATENT DOCUMENTS 3,286,312  3/1965  Davis et al. .................. 428/446
3,971,874  7/1976  Ohta .
4,180,596  12/1979  Crowder et al. .......... 148/DIG. 147
4,227,944  10/1981  Brown et al. ............. 148/DIG. 147
4,285,761  8/1981  Fatula, Jr. et al. ....... 148/DIG. 147

FOREIGN PATENT DOCUMENTS 57-157247  9/1982  Japan .
57-157249  9/1982  Japan .
58-54338   3/1983  Japan .
6137       2/1984  Japan .

OTHER PUBLICATIONS

Murarka, S. P., Refractroy Silicides for Integrated Circuits, J. Vac., Sci. Technol., vol. 17, No. 4, Jul./Aug. 1980, p. 788.

Primary Examiner—John E. Kittle
Assistant Examiner—Beth A. Bozzelli
Attorney, Agent, or Firm—Lowe, Price, Leblanc, Becker & Shur

[57] ABSTRACT

A transition metal silicide film 3 is formed on a transparent substrate 1, and an oxidized transition metal silicide film 4 is formed on said transition metal silicide film 3. Dry etching can be easily applied to the transition metal silicide film 3 and the oxidized transition metal silicide film 4. Since the silicified metal films have good adhesion to the transparent substrate 1, the fine patterns can hardly be detached at the time of mask rinsing. In addition, the oxidized transition metal silicide film 4 has a low reflection factor, which prevents the lowering of the resolution.

4 Claims, 2 Drawing Figures

PHOTOMASK MATERIAL

BACKGROUND OF THE INVENTION

1. Field of the Invention

This invention relates to a photomask material and particularly to a photomask material to be used for manufacturing a semiconductor device.

2. Description of the Prior Art

As a mask to be used for manufacturing a semiconductor device, a photograghic emulsion plate formed by a glass substrate was generally utilized in the early days. However, according to the tendency toward high integration with fine patterns, hard masks including a metallic thin film of.such as chromium (Cr) formed on a transparent glass substrate are widely utilized these days (for example, see Japanese Patent Laying-Open Gazette No. 157247/1982 or No. 157249/1982).

FIG. 2 is a sectional view of a conventional photomask material. In the figure, a metal film 2 of chromium or the like is formed on a transparent glass substrate 1 of quartz or the like. This metal film 2 of Cr or the like is formed to a thickness of approximately 600 to 800 Å on the transparent glass substrate 1 by an evaporation or sputtering process. In order that a photomask for a semiconductor device may be obtained, photoresist or resist for an electron beam (referred to hereinafter as EB) is coated on the metal film 2 and patterns are formed by irradiation of light or EB, and after that, a developing process and an etching process etc. are applied. If the metal film 2 is formed of Cr, etching is applied by using ceric antimony nitrate and perchloric acid in the case of a wet process or a mixed gas of carbon tetrachloride ($CCl_4$) and oxygen ($O_2$) in the case of a dry process. In manufacturing of a mask for a semiconductor device, particularly a highly integrated device having fine patterns such as VLSI, a dry etching process which produces little effect of side etching is preferred.

Although a wet etching process is generally adopted for manufacturing a Cr mask to be used as a mask for manufacturing a conventional semiconductor device, it is difficult in a wet etching process to obtain a mask of high precision due to a side etching effect and the like, while in a dry etching process, the etching speed of Cr is lower than approximately 100 Å/min and a ratio of selection of resist is not appropriate and, therefore, the dry etching process is not suited for mass production of photomasks. In addition, in the case of a Cr mask, adhesion to the transparent substrate, particularly the substrate of quartz glass is not good, causing fine patterns to peel off at the time of rinsing the mask.

As means for solving the above stated problems, a method might be considered in which a metal silicide film formed by a silicide transition metal of molybdenum (Mo), tantalum (Ta), tungsten (W) or the like is used as a mask material (for example, see Japanese Patent Application No. 61372/1984). More specifically, silicon (Si) contained in the quartz glass substrate and silicon (Si) contained in the metal silicide film as a mask material are effectively combined to produce strong adhesion. As for etching, dry etching can be easily done (at an etching speed of 1000 Å/min) by using mixed gas plasma containing carbon tetrafluoride ($CF_4$) and oxygen ($O_2$), compared with the case of a chromium (Cr) mask.

However, the above stated transition metal silicide film has a light reflection factor as high as approximately 50% and as a result, at the time of pattern printing, the resolution of the patterns is decreased due to diverse scattering of light between the wafer and the mask, which makes it difficult to manufacture a VLSI device having submicron patterns.

SUMMARY OF THE INVENTION

An object of this invention is to provide a photomask material of high quality having an excellent adhesive property with respect to a transparent substrate and a low reflection factor, dry etching being easily performed.

Briefly stated, the present invention includes a transparent substrate, a transition metal silicide film formed on the transparent substrate and an oxidized transition metal silicide film formed on the transition metal silicide film.

According to the present invention, dry etching can be easily applied to a transition metal silicide film and an oxidized transition metal silicide film and since the silicified metal films have good adhesion to the transparent substrate, the fine patterns can hardly be detached at the time of mask rinsing. In addition, the oxidized transition metal silicide film has a low reflection factor, which prevents the lowering of the resolution.

These objects and other objects, features, aspects and advantages of the present invention will become more apparent from the following detailed description of the present invention when taken in conjunction with the accompanying drawings.

DESCRIPTION OF THE PREFERRED EMBODIMENT

Figure 1:
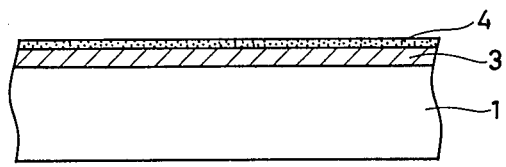
FIG. 1 is a sectional view of a photomask of an embodiment of the present invention.
Figure 2:
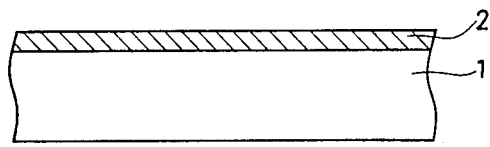
FIG. 2 is a sectional view of a conventional photomask material.

FIG. 1 is a sectional view of a photomask material of an embodiment of the present invention. In FIG. 1, on a transparent glass substrate 1 of quartz glass or the like, a silicide film 3 of a transition metal such as molybdenum (Mo), tungsten (W), or tantalum (Ta) is formed to have a thickness of approximately 1000 Å by a sputtering process or the like. On the transition metal silicide film (hereinafter referred to as the metal silicide film) 3, an oxidized transition metal silicide film 4 is formed to have a thickness of 100 to 200 Å. As the oxidized transition metal silicide film (hereinafter referred to as the oxidized metal silicide film) 4, a silicide film of oxidized molybdenum ($MoSi_2O_x$), a silicide film of oxidized tungsten ($WSi_2O_x$), a silicide film of oxidized tantalum ($TaSi_2O_x$) or the like is used. For example, an oxidized molybdenum silicide film ($MoSi_2O_x$) can be formed by combination of $MoSi_2$ and $O_2$ with an appropriate ratio by a sputtering process using a plasma containing argon (Ar) and oxygen ($O_2$) mixed at an arbitrary ratio with molybdenum silicide ($MoSi_2$) as a target. An oxidized molybdenum silicide film can be also formed by sputtering using an Ar plasma with a target of oxidized molybdenum silicide formed beforehand at an appropriate ratio. If the value of x in $MoSi_2O_x$ becomes large, the reflection factor is lowered but the film becomes gradually insulated. For manufacturing a mask by an electron beam (EB), a problem of charging up has to be considered. However, since the oxidized metal silicide film 4 has a thickness of only approximately 100 to 200 Å as described above, the electron beam EB (10 to 20 KeV) attains the lower metal silicide film 3 and, therefore, even if x is a large value, said problem does not arise. Accordingly, the oxidized metal silicide film 4 may be a complete insulator, conversely, x may be about "1". In this case, said sputtering process is performed using a plasma containing Ar gas and $O_2$ gas mixed at a ratio of "1:1".

As described previously in connection with the prior art, if only the metal silicide film is used as a mask material, the resolution of the pattern is decreased. By contrast, if the oxidized metal silicide film 4 is formed on the metal silicide film 3 as described above, a high resolution can be obtained since the oxidized metal silicide film 4 has a low reflection characteristic. In addition, a silicified metal film has good adhesion to a transparent substrate (of $SiO_2$, $Al_2O_3$ or the like), particularly a quartz glass substrate. Consequently, when it is used as a photomask, such a photomask has an advantage that a long lifetime is assured (in other words, the fine patterns will hardly be detached by rinsing the mask).

In addition, the metal silicide film 3 and the oxidized metal silicide film 4 can be easily etched by a dry etching process. For example, in the case of molybdenum silicide, etching is completed with a speed of approximately 1000 Å/min under the conditions of a degree of vacuum of 0.2 Torr and electric power of 300 W using a gas of mixture of $CF_4+O_2$ (2%). Although the etching speed of the oxidized metal silicide film 4 such as an oxidized molybdenum silicide film is a little slower than that of the metal silicide film 3, the oxidized metal silicide film 4 is as thin as 100 to 200 Å and, therefore, etching can be applied easily. Accordingly, the etching speed of the above described embodiment is approximately ten times as fast as the dry etching speed of a conventional case using a Cr film and it can be understood that the embodiment of the present invention is suited for mass production of photomasks. In the above described embodiment, prior to the dry etching, a photoresist or an EB resist of a thickness of 4000 to 6000 Å is coated on the oxidized metal silicide film 4 and after that, patterns are formed on the transparent glass substrate 1 using a light or an EB. If an EB is used for patterning, a problem of charging up does not arise since the oxidized metal silicide film 4 is as thin as approximately 100 to 200 Å.

As described in the foregoing, according to the present invention, a silicide film of a transition metal is formed on a transparent substrate and silicide film of an oxidized transition metal is further formed on the above stated transition metal silicide film. As a result, patterns are formed with a high resolution and good adhesion to the transparent substrate is obtained. Furthermore, dry etching can be applied easily with an increased speed. Thus, a photomask material of high quality suited for mass production can be obtained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A photomask material to be used for manufacturing of a semiconductor device, comprising:
    a transparent substrate,
    a transition metal silicide film formed on said transparent substrate, and
    an oxidized transition metal silicide film formed on said transition metal silicide film.

2. A photomask material in accordance with claim 1, wherein
    the transition metal used in said oxidized transition metal silicide film is the same as the transition metal used in said transition metal silicide film.

3. A photomask material in accordance with claim 2, wherein
    the transition metal used in said transition metal silicide film and said oxidized transition metal silicide film is molybdenum (Mo) or tantalum (Ta) or tungsten (W).

4. A photomask material in accordance with claim 1 wherein
    said transparent substrate is formed of quartz glass or sapphire.

* * * * *